United States Patent [19]

Kober et al.

[11] 4,399,844

[45] Aug. 23, 1983

[54] COMPONENT LEAD BENDING AND CRIMPING TOOL

[75] Inventors: Marvin Kober, Spring Valley; Eugene Battaglia, New York, both of N.Y.

[73] Assignee: O.K. Machine and Tool Corp., New York, N.Y.

[21] Appl. No.: 371,255

[22] Filed: Apr. 23, 1982

[51] Int. Cl.³ .............................................. B21F 1/00
[52] U.S. Cl. .................................... 140/106; 72/384; 72/477
[58] Field of Search ................... 140/105, 106, 123, 1; 72/384, 477

[56] References Cited

U.S. PATENT DOCUMENTS

| | | | |
|---|---|---|---|
| 3,142,484 | 7/1964 | Press | 140/106 |
| 3,360,018 | 12/1967 | Lindsay | 140/106 |
| 3,692,069 | 9/1972 | Clendennen et al. | 140/106 |
| 4,274,450 | 6/1981 | Doerge | 140/123 |

*Primary Examiner*—Francis S. Husar
*Assistant Examiner*—Linda McLaughlin

[57] ABSTRACT

A novel component lead bending and crimping tool comprises a generally triangularly-shaped handle with recessed sides forming grooved raised edges providing plural component positions for forming right-angle bends in its leads. A crimping apparatus is mounted at the wide end of the tool for forming crimps in the wire leads at desired locations. Various slots and holes are provided in the handle and in the crimping apparatus walls to accommodate the wire leads during various wire bending and crimping procedures.

12 Claims, 18 Drawing Figures

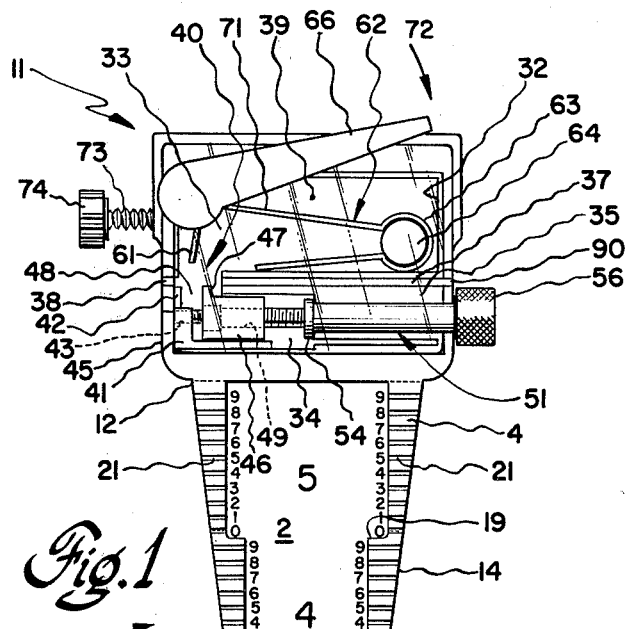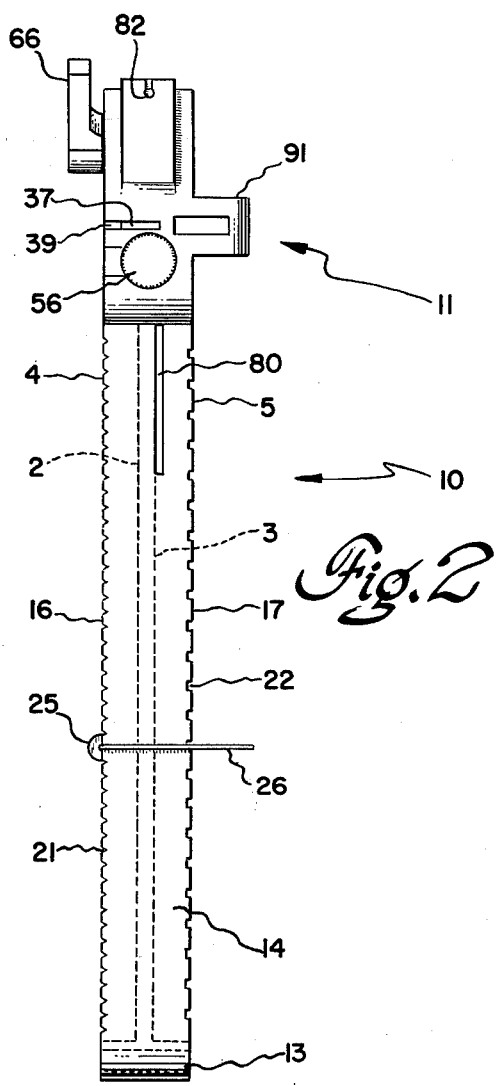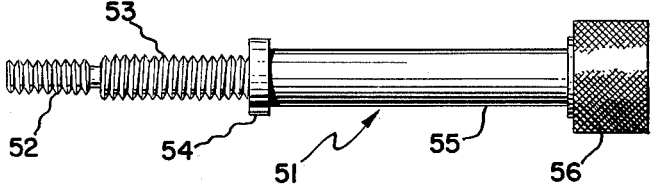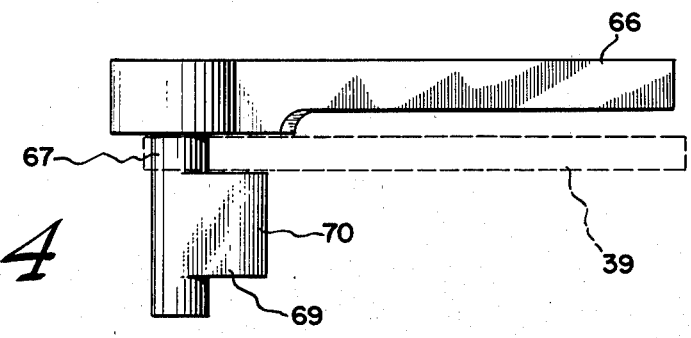

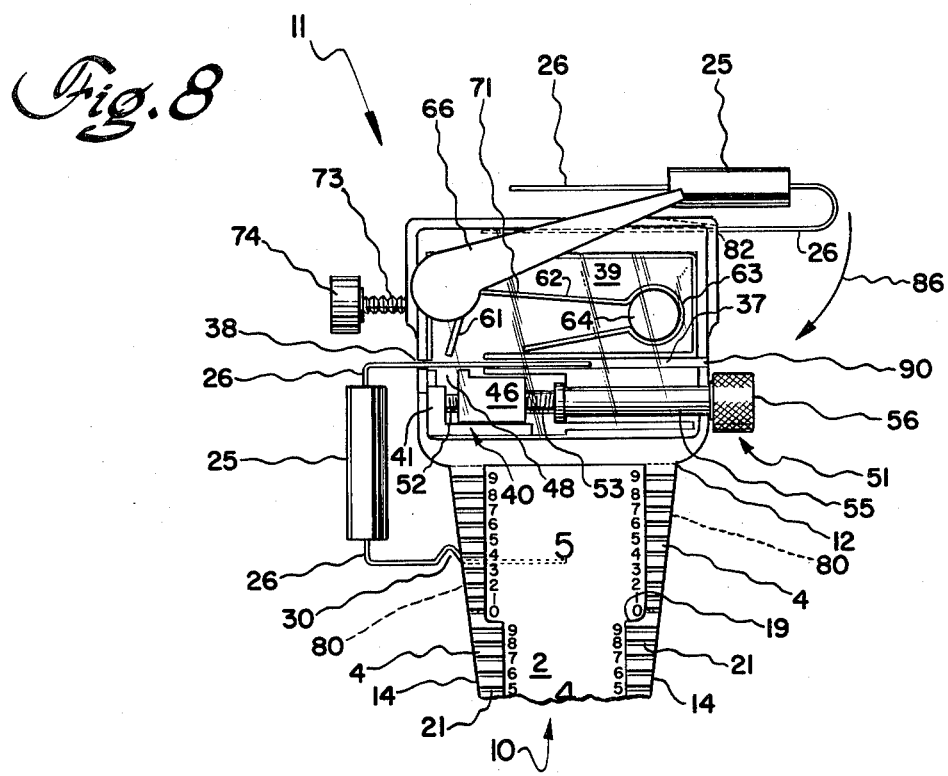
Fig. 8
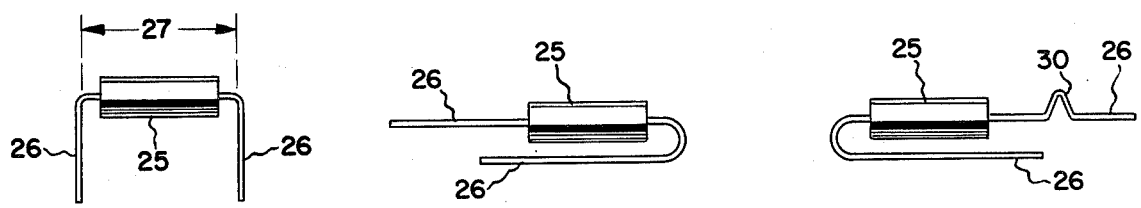
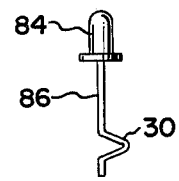
Fig. 9A
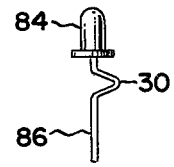
Fig. 9B
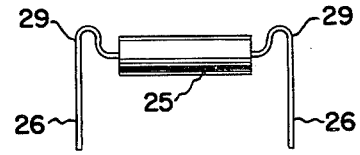
Fig. 9C
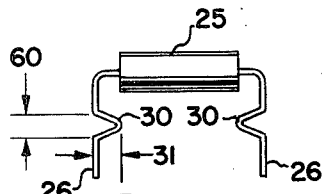
Fig. 9D  Fig. 9E  Fig. 9F
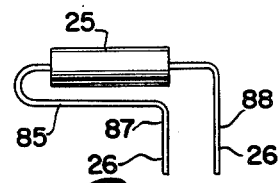
Fig. 9G  Fig. 9H

COMPONENT LEAD BENDING AND CRIMPING TOOL

This invention relates to a component lead bending and crimping tool.

BACKGROUND OF THE INVENTION

When electronic components with wire leads, such as resistors, capacitors, diodes and transistors, are mounted on a printed circuit board (PCB), it is frequently necessary or desirable to bend the leads to enable a desired orientation of the component body or its leads relative to the PCB holes which receive the leads for soldering to the circuit pattern. It is also desirable or necessary to crimp the leads at desired locations, the crimp forming a sharp bend in the lead that will not pass through the PCB hole, thus positioning the component at the desired height over the PCB surface.

U.S. Pat. No. 3,142,484 describes a hand tool for making right angle bends in the axial leads of an electronic component. However, this patent does not describe how to make vertical bends or other desired configurations which would allow optimum orientation of the component on the PCB. Moreover, this patent does not describe how to crimp component leads. Hand tools are commercially available for forming crimps in component leads. Such tools, which are in the plier class, provide for split blades on one jaw, and a single blade on the opposing jaw, positioned to fit between the split blades. The wire lead is placed across the split blades and is crimped when the single blade is brought down as the pliers are closed. A U-shaped crimp results, whose width is fixed by the non-adjustable split blade spacing, and whose depth is controlled by the user pressure. This tool cannot be used for lead bending as described in the aforementioned patent.

The chief object of the invention is a novel hand tool capable of bending component leads in a plurality of directions and at different locations along the wire leads to form a plurality of lead configurations for desired mounting on a PCB, and is also capable of forming crimps in the wire leads at desired locations along the straight or bent wire leads.

Another object of the invention is a novel wire bending and crimping tool which is compact, capable of low cost manufacture, easy to use, and very versatile.

These and further objects and advantages of the invention as will appear hereinafter are achieved with a novel hand tool comprising a handle portion having a generally triangular shaped body portion forming a narrow end and a wide end. The body portion has raised edges or lands on one or both sides, with plural parallel aligned grooves for receiving the axial leads of a component positioned between the aligned grooves whose spacing from the body portion's side surfaces determines the locations for forming right angle or transverse bends in the leads. Mounted on the handle portion's wide end is lead crimping apparatus comprising a slot for receiving the lead to be crimped, means forming a user adjustable gap located below the slot for receiving the wire crimp and determining the crimp width, and means located above the slot for moving a crimping blade against the lead when in the slot and forcing it into the crimping gap a preselected depth. As a further feature, the crimping tool support is shaped at a corner adjacent a lead-receiving hole for vertical or reverse bending of a component lead when inserted in the hole.

Other features and advantages of the invention will be described hereinafter in connection with the following detailed description of a preferred embodiment of the tool of the invention, taken in conjunction with the accompanying drawings.

BRIEF DESCRIPTION OF DRAWINGS

FIG. 1 is a plan view from the front side of one form of bending and crimping tool in accordance with the invention;

FIG. 2 is a side view, from the right, of the tool of FIG. 1;

FIG. 3 is a plan view of the block adjusting screw used in the tool of FIG. 1;

FIG. 4 is a side view of the crimp actuating lever used in the tool of FIG. 1;

FIG. 8 is a partial view similar to FIG. 1 showing how the tool can be used to make wire crimps and certain wire bends;

FIGS. 9A–9H show components with various lead configurations, crimped and uncrimped, that can be made with the tool of the invention;

DETAILED DESCRIPTION OF PREFERRED EMBODIMENT

Figure 5:
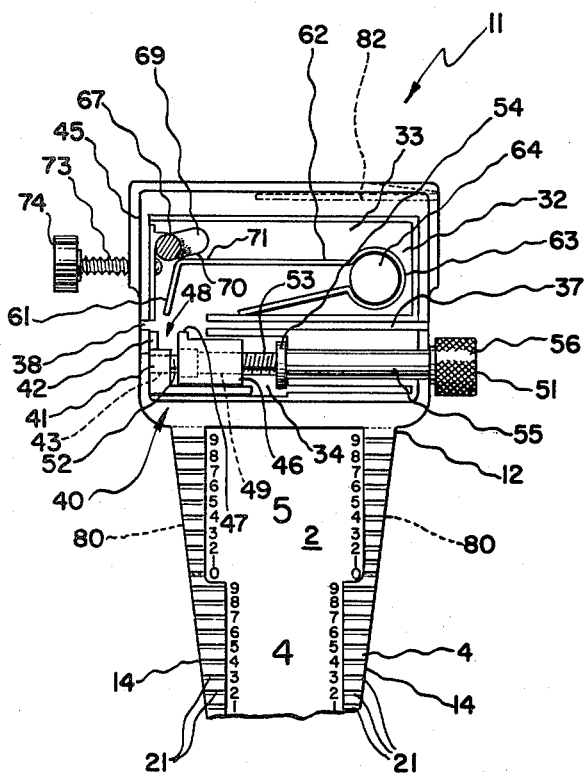
FIG. 5 is a partial view similar to FIG. 1 with the crimp actuating lever and lid removed to show the spring outline in its relaxed position.

Referring now to the drawings, FIG. 1 is an enlarged plan view of one form of crimping and bending tool in accordance with the invention. The tool comprises a main body part 10 which functions to form right-angle or transverse bends of wire leads and which also functions as a handle or support portion for crimping apparatus, designated 11, mounted at one end of the body. The handle portion 10 comprises a generally triangular shaped block having a wide end 12 and a narrow end 13. The block has flat side surfaces 14 extending perpendicular to the front 16 and back 17 block surfaces. Each of the front 16 and back 17 surfaces are recessed 2, 3 defining raised edges or lands 4, 5 adjoining the side surfaces 14. The top recess 2 is stepped, as for example at 19, so that the raised edges 4 have varying widths (the edge width refers to the short dimension; the varying widths being designated by references 8 and 9), whereas the bottom recess 3 (see FIG. 6) is triangular so that the raised edges 5 have a uniform width 7. The raised edges 4, 5 are provided, respectively, with aligned horizontal grooves 21, 21; 22, 22 extending perpendicular to the longitudinal axis of the handle 10, which axis corresponds to a line running from the triangle apex 13 to the center of the triangle base 12. On the top surface 16, sets of ten shallow grooves 21 are provided in each stepped section, except for the lowermost section adjacent the apex 13 where seven grooves are provided. On the bottom surface 17, a total of twenty-three deeper grooves 22 are provided in each raised edge 5, which grooves are uniformly spaced.

Figure 6:
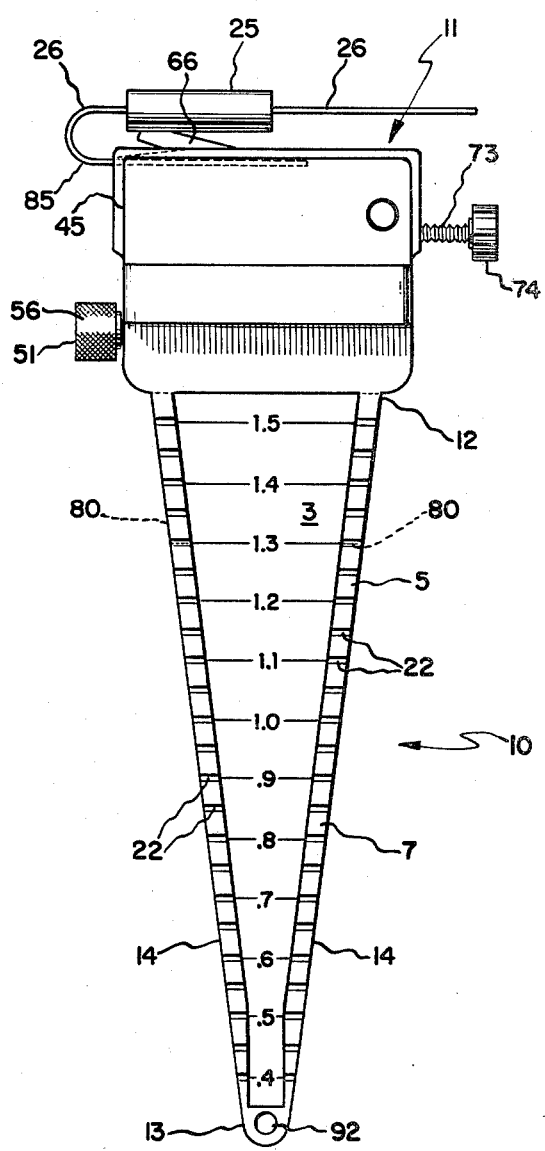
FIG. 6 is a view similar to FIG. 1 but of the back or opposite side of the tool.

In use, as illustrated in FIG. 1, the component 25 is positioned within the top recess 2 and its axial leads 26 located in the aligned grooves 21 whose spacing, measured from the side surfaces 14 and designated 27 in FIG. 9A, corresponds to the hole-to-hole spacing on the PCB on which the component is to be mounted. The user then simply bends the leads 26 over the edges defined by the intersecting grooves 21 and side surfaces 14, until the leads 26 engage the side surfaces 14, as shown in FIG. 2, thus forming bends in the wires 26 herein referred to as right-angle or transverse bends. When the component body axis is maintained level with the groove bottom, as shown in FIG. 2, the resultant leaded component looks as illustrated in FIG. 9A. However, the depth of the recesses 2, 3 is such that the component body axis can be lowered below the groove bottom, with the result that when the component 25 is placed on the back or bottom side 17, where the raised edge 5 width 7 is small and uniform, and then the right-angle bends formed, the resultant component 25 looks like that illustrated in FIG. 9F. The extra loop, indicated at 29' provided in each lead 26 can act to take up any stresses resulting from displacement of the component after mounting on the PCB. Both lead configurations depicted in FIGS. 9A and 9F are for horizontal mounting of the components. The triangular shape of the block 10 allows for variation at the user's option of the spacing 27 between the transverse bends to accommodate different PCB hole-to-hole spacings. The widened raised edge lands 8 on the top surface 16 facilitate the normal lead bends depicted in FIGS. 9A, whereas the narrow raised edge lands 5 on the opposite tool side facilitate the lead configurations with the stress-relief loops 29 shown in FIG. 9F. Appropriate indicia, as shown in FIGS. 1 and 6, can be marked on the front and back surfaces to indicate actual bend spacings for each lead forming position or arbitrary settings as a reference for production purposes.

It is also desirable for PCB component mounting to crimp 30 the wires as depicted in FIG. 9G, with the crimp depth, referenced 31, chosen to exceed the PCB hole diameter, so that the component before soldering rests on its crimps 30 on the PCB at a desired height above the board. Apparatus 11 for forming such wire crimps 30 is mounted at the wide end 12 of the body, and comprises a compartment 32 divided into upper 33 and lower 34 parts separated by wall portions 35 forming a slot or groove 37 for receiving the component lead 26 through a vertical slot 38 located in the outer wall. The compartment 32 is closed by a transparent lid 39, so that the tool action is visible to the user.

In the lower compartment 34 is mounted a crimping block 40, comprising a first horizontally movable portion 41 with an upstanding ledge 42 and having a right-hand threaded hole 43. The first portion 41 is located adjacent the outer wall section 45 in the lower compartment. The block 40 also comprises a horizontally movable second portion 46 whose upstanding surface 47 adjacent the ledge 42 of the first portion 41 forms with the ledge 42 a crimping gap 48. The movable portion 46 has a larger left-hand threaded hole 49 aligned with the threaded hole 43 in the first portion 41. A block adjusting screw 51, depicted in FIG. 3, threadingly engages the first block portion hole 43 via a first reduced diameter right-hand threaded section 52, and the second portion hole 49 via a second enlarged diameter left hand threaded section 53, followed by a shoulder 54 and a smooth cylindrical section 55 which terminates in a knurled knob 56 which extends outside the lower compartment 34. When the knob 56 is rotated clockwise by the user, the crimping gap 48 narrows, and when rotated counterclockwise the gap 48 widens, the second block 46 being displaced by the rotating threaded section 53 to the left in FIG. 1 in the first case, and to the right in FIG. 1 in the second case, the first portion 41 being simultaneously displaced in the opposite directions. By this means, the user is able to control the crimp width, referenced 60 in FIG. 9G. The opposite screw threading which causes the first 41 and second 46 block portions to be displaced toward and away from each other serves to maintain the crimping gap 48 centered under the bent end 61 of the crimping blade in any of the possible adjustments.

The upper compartment 33 contains a crimping blade formed by the downwardly bent end 61 of a generally U-shaped flat member 62 made of spring steel and disposed horizontally as shown in FIG. 5. The bight end 63 of the spring seats on an upstanding post 64 in the upper compartment 33. The crimping blade 61 is actuated by a lever 66 mounted over the transparent lid 39 and having a narrow shoulder portion 67 which is journalled in a rounded slot in the transparent lid corner and has below the shoulder portion located in the upper compartment 33 a camming portion 69, shown in greater detail in FIG. 4. The camming surface designated 70 engages the top 71 of the flat spring 62 so that when the lever 66 is positioned above the horizontal as shown in FIG. 1, the crimping blade 61 is in its uppermost position and the flat spring 62 is unstressed. When the lever 66 is manually rotated downward below the horizontal as indicated by the arrow 72 to the position illustrated in FIG. 5, the crimping blade 61 is moved downward against the spring action toward and into the crimping gap 48. An adjustable stop mechanism is provided to afford user control of the crimp depth 31. In a preferred form, it comprises a screw 73 with a knurled knob 74 located external of the tool, the screw 73 extending via a threaded hole in the side wall into the upper compartment 33 in a position to engage with its end a side surface of the camming portion 69 when the lever 66 is rotated downward. Rotation of the screw 73 inward into the upper compartment 33 causes the lever 66 to come to an earlier stop thus reducing penetration of the crimping blade 61 into the crimping gap 48. Retraction of the screw 73 allows the crimping blade 61 under control of the user to penetrate more deeply into the crimping gap 48 thus increasing the depth 31 of the crimp 30. As a result, both the depth 31 and the width 60 of the wire lead crimp 30 are independently adjustable by the user in the tool of the invention. When the crimping lever 66 is released, the flat spring 62 restores the lever to its original position as depicted in FIG. 1.

In operation, when both axial leads of the component remain straight, the user inserts one axial lead at a time into the crimping slot 37 via the side slot 38 until the lead portion to be crimped is located over the crimping gap 48. Before or after, the user adjusts the gap width by adjusting the block adjusting screw 56 to the desired crimp width 60, and adjusts the crimp depth 31 by adjusting the lever adjusting screw 74. Then, the user rotates the lever 66 downward (FIG. 5) until stopped by the screw 73 end. This action, depicted in FIG. 7, cams the crimping blade 61 downward to engage the wire against the upstanding block ledges 42, 47, forcing the wire lead 26 into the crimping gap 48 forming a V-shaped crimp 30 of a desired width and depth as depicted in FIG. 9G.

The vertical orientation of the side slot 38 allows the crimped lead to be removed by aligning the crimp depth 31 with the long slot dimension. When the crimps are to be formed in right-angle bent leads, then provision must be made to accommodate the second bent lead, with or without a crimp, while the first lead is being crimped. This is accomplished by providing elongated slots 80 in both handle sides 14, which slots pass entirely through the handle side wall and opens up into the recess 3 formed on the back side of the tool handle. The left-hand slot 80 (FIG. 8) will receive the second lead of the component while the first lead is being crimped, and will receive the first crimped lead while the second lead is being crimped, as depicted in FIG. 8. The elongated slots 80 are made long enough to accommodate the widest lead spacing 27 that would be expected to be encountered during use of the tool. The resultant lead configuration is depicted in FIG. 9G. In the normal use of the tool, only the slot 80 on the left side 14 of the tool shown in FIG. 8 is used with the crimping apparatus 11 as just described.

The crimping apparatus 11 is also provided with means for forming vertical, reverse or 180° bends in the component leads, for vertical mounting of such components on the PCB. In the preferred embodiment, this takes the form of an elongated horizontal hole 82 in the right side wall of the tool and extending parallel to the tool top surface (see FIGS. 2 and 5). The corner adjacent this hole 82 is referenced 83. The hole 82 is sized to accommodate the typical component lead length.

Figure 10:
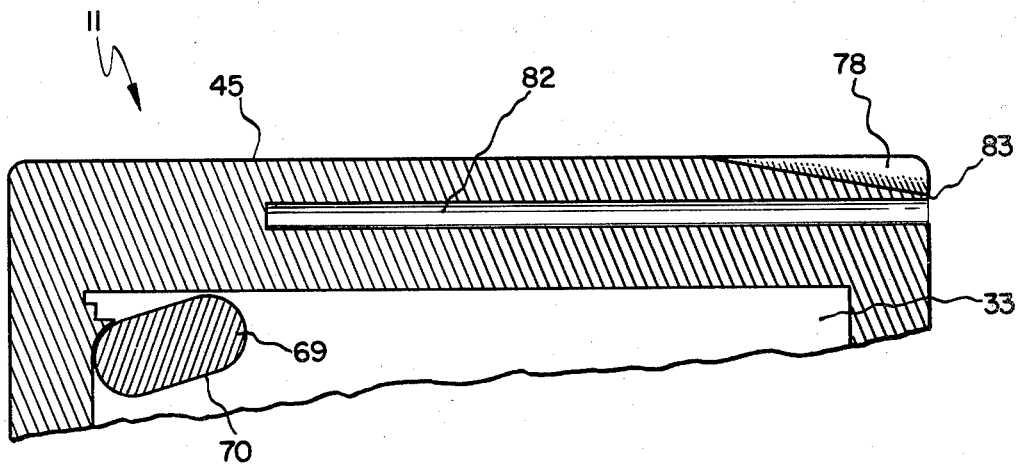
FIG. 10 is a partial cross-section of the tool top along the line 10—10 of FIG. 11.
Figure 11:
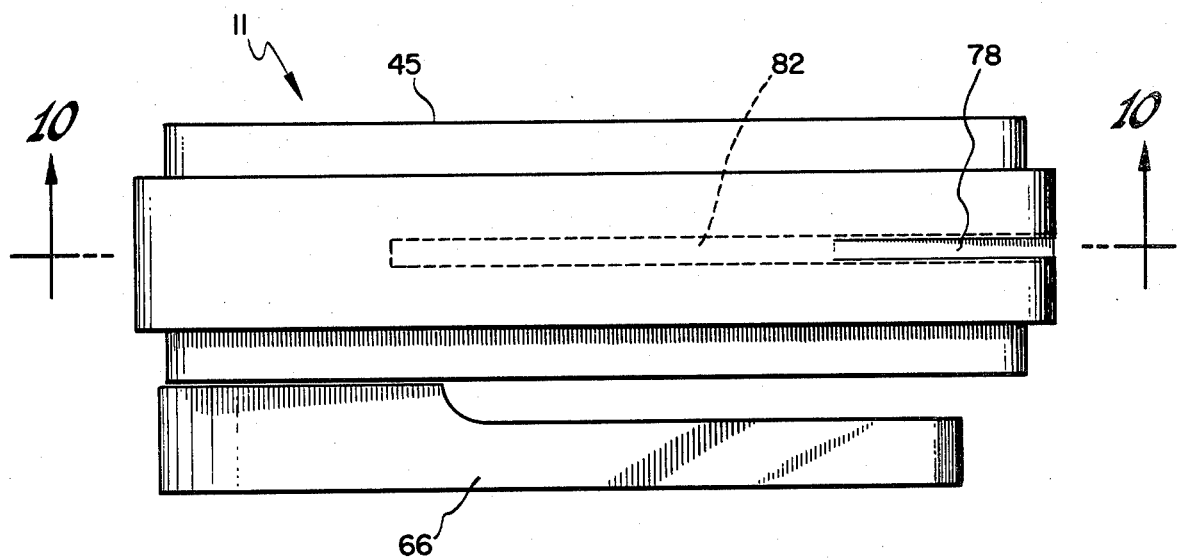
FIG. 11 is an enlarged plan view of the tool top.

In operation, the user inserts the component lead 26 into the hole 82 to the desired depth, and then bends the component body 25 around the tool corner 83 until it engages the tool top wall as depicted in FIG. 6. The resultant lead configuration is depicted in FIG. 9B. If desired, a crimp 30 can first be formed in the straight lead, as depicted in FIG. 9C, so that the component sits a desired height above the PCB. As shown in FIGS. 10 and 11, adjacent the tool corner 83 is provided a wedge-shaped groove or recess 78 in the top block surface. This is used to guide the component body during the bending process to ensure it is aligned over the hole 82.

Figure 7:
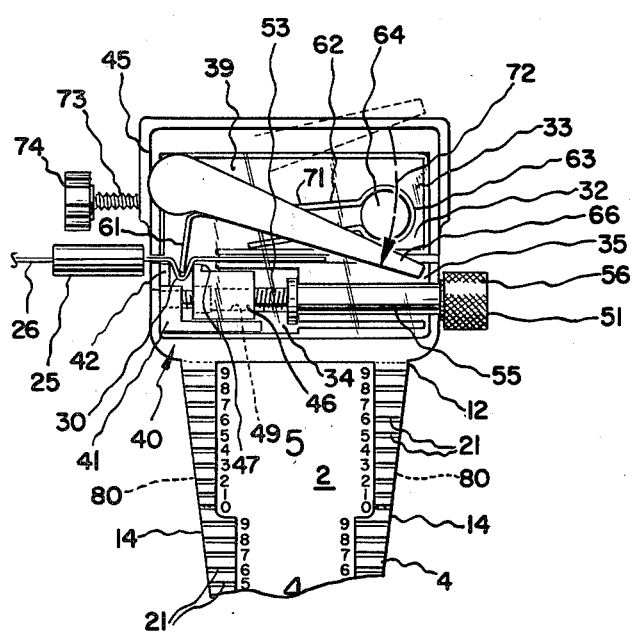
FIG. 7 is a partial view similar to FIG. 1 showing the crimp actuating lever in its actuated position.

FIGS. 9D and 9E illustrate LEDs 84 with single leads 86 in which crimps 30 have been formed with the crimping apparatus 11 of the tool of the invention in a manner similar to that described in connection with FIG. 7, for vertical mounting of the LEDs on a PCB. FIG. 9H shows another lead configuration for offset horizontal mounting of a component 25. In this case, first a 180° bend 85 is made in one axial lead, as depicted in FIG. 6. Next, the same lead is reinserted to a smaller distance in the same corner hole 82, and then the component bent in the direction of the arrow 86 as depicted at the right side of FIG. 8 to produce the right-angle bent portion 87 shown in FIG. 9H. Finally, a right-angle bend designated 88 is made in the other axial lead. This can be done using the same corner hole 82. The second slot 80 on the right side of the tool (FIG. 2) can also be used for this purpose. The groove or slot 37 which receives the lead 26 for crimping when inserted in side slot 38 on the left wall, also is accessible from the right tool side via a vertical slot 90, which has the same configuration as side slot 38 and which slot 90 can also be used for making wire bends. When the latter is so used, the elongated slot 80 on the same right tool side can serve to accommodate a previously bent component lead.

As will be evident from the foregoing description, the component lead bending and crimping tool of the invention offers a number of advantages over existing tools. It combines into essentially a one piece bending tool which is compact and low weight the mechanism for forming crimps at desired locations along the wire leads. The crimps can have independently adjustable depths and widths. V-shaped, rather than U-shaped, crimps are formed. This has the advantage that when the crimped lead is pushed into the PCB hole, it exerts tension against the plated hole sides. This reduces the danger of component shifting or toppling before or during soldering. The placement of the lead bending holes and slots allows for easy use of the tool to form a wide variety of lead configurations with or without crimps. The stepped sections on the front tool side facilitates the common right angle bends with minimum stress on the component body where the leads emerge, whereas the deep recess on the back side in combination with the narrow raised edges facilitates lead configurations with the stress-relief loops. The shallow grooves on the front side readily accommodates small components, whereas the deeper grooves on the back side accommodates larger components with heavier leads. The large number of grooves of varying end-to-end spacings provides many lead-forming positions and will accommodate most components used for PCB mounting in vertical, horizontal, and offset-horizontal positions. The tool is simple and can be manufactured at low cost. The one-piece body can be made of inexpensive molded plastic, and the remaining parts of the crimping apparatus fitted into the two compartments from the top side and then closed off by addition of the transparent lid. In use, the tool is very versatile. It can be held by the handle portion 10 while the crimper 11 is operated. Or it can be used on a workbench. A downwardly projecting base portion 91 under the crimping apparatus can be used as a bench support. Alternatively, the base portion 91 can be mounted in a vise to provide a more rigid tool support. A hole 92 is provided at the apex 13 by which the tool may be hung on a wall adjacent a work area. The tool can be used with many kinds of electrical components, such as axial-leaded resistors and capacitors, single-leaded LEDs, dual-leaded diodes, and multi-leaded transistors.

While our invention has been described in connection with specific embodiments thereof, those skilled in the art will recognize that various modifications are possible within the principles enunciated herein and thus the present invention is not to be limited to the specific embodiments disclosed.

What is claimed is:

1. A component lead bending and crimping tool for adjustably bending and crimping one or more of its axial leads, comprising a handle portion having a generally triangularly shaped body portion with converging outer raised edges having plural parallel aligned grooves for receiving the component's oppositely-extending axial leads for transverse bending of its leads, said handle portion further comprising a block having recessed front and back surfaces for receiving the component body when its leads are positioned in one set of aligned grooves, the raised edges formed by the recess on the front surface having a stepped outline forming raised lands of varying width, the raised edges formed by the recess on the back surface having a straight outline forming raised lands of uniform width, the depth of the grooves on the front surface of the handle portion being different from the depth of the grooves on the back surface, the recess on the back surface being sufficiently deep to allow the component body axis to be located below the depth of the grooves on the raised lands on said back surface, means on the tool for receiving and vertical bending of one or more of the component's leads, and means on the tool under control of the user for receiving and crimping one or more of its leads at a preselected location along the lead.

2. A component lead bending and crimping tool as claimed in claim 1, characterized in that an elongated through-slot is formed in the side of the handle portion in a position to accommodate a right-angle bent lead of the component while its other right-angle bent lead is positioned in the lead-receiving means during a crimping operation on said other lead.

3. A component lead bending and crimping tool as claimed in claim 1, characterised in that the vertical bending means comprises a hole adjacent a corner of the tool and sized to receive a component lead.

4. A component lead bending and crimping tool as claimed in claim 3 and further comprising means on the external surface of said tool and located above the said hole for guiding the component during the bending process so that the component is aligned with the said hole.

5. A component lead bending and crimping tool for adjustably bending and crimping one or more of its axial leads, comprising a handle portion having a generally triangularly shaped body portion with converging outer raised edges having plural parallel aligned grooves for receiving the component's oppositely-extending axial leads for transverse bending of its leads, means on the tool for receiving and vertical bending of one or more of the component's leads, means on the tool under control of the user for receiving and crimping one or more of its leads at a preselected location along the lead, said crimping means comprising a body portion that is an extension of the handle portion and comprises a compartment having outer walls and inner walls defining a wire lead receiving slot on an outer wall aligned with a lead receiving groove inside the compartment, means forming a crimping gap on one side of the wire when positioned within its receiving groove, means forming a crimping blade on the opposite side of the wire when so positioned, and means for displacing the crimping blade toward and into the crimping gap, said crimping gap forming means comprising means for independently adjusting the gap width.

6. A component lead bending and crimping tool as claimed in claim 5, wherein the crimping gap forming means comprises a first fixed block and a second cooperating moving block, and means for displacing the moving block with respect to the fixed block to adjust the gap width.

7. A component lead bending and crimping tool as claimed in claim 6, wherein the displacing means comprises an elongated screw having a first right hand threaded section for threadingly engaging a similarly threaded hole in the first block and a second left hand threaded section for threadingly engaging a similarly threaded hole in the second block, the screw having a user adjustable end extending external to the compartment.

8. A component lead bending and crimping tool for adjustably bending and crimping one or more of its axial leads, comprising a handle portion having a generally triangularly shaped body portion with converging outer raised edges having plural parallel aligned grooves for receiving the component's oppositely-extending axial leads for transverse bending of its leads, means on the tool for receiving and vertical bending of one or more of the component's leads, means on the tool under control of the user for receiving and crimping one or more of its leads at a preselected location along the lead, said crimping means comprising a body portion that is an extension of the handle portion and comprises a compartment having outer walls and inner walls defining a wire lead receiving slot on an outer wall aligned with a lead receiving groove inside the compartment, means forming a crimping gap on one side of the wire when positioned within its receiving groove, means forming a crimping blade on the opposite side of the wire when so positioned, and means for displacing the crimping blade toward and into the crimping gap, said crimping blade comprising one end of a U-shaped flat metal spring mounted in the compartment.

9. A component lead bending and crimping tool as claimed in claim 8, wherein the crimping blade displacing means comprises an external lever journalled on a compartment wall and having a camming portion for engaging the metal spring for displacing the crimping blade when the lever is actuated by a user.

10. A component lead bending and crimping tool as claimed in claim 9, characterized in that the compartment is closed off by a transparent lid through which the compartment interior is visible to the user.

11. A component lead bending and crimping tool as claimed in claim 10, characterized in that adjustable stop means is mounted on a compartment wall for stopping the lever movement and thus controlling the depth of a crimp to be formed in a wire.

12. A component lead bending and crimping tool as claimed in claim 11, characterized in that the stop means comprises an adjustable screw whose end located in the compartment is located in a position to receive and stop the lever camming portion.

* * * * *